(12) United States Patent
Choi

(10) Patent No.: US 8,314,788 B2
(45) Date of Patent: Nov. 20, 2012

(54) ORGANIC LIGHT EMITTING DISPLAY DEVICE

(75) Inventor: Sang-moo Choi, Suwon-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 780 days.

(21) Appl. No.: 12/004,283

(22) Filed: Dec. 19, 2007

(65) Prior Publication Data

US 2008/0143704 A1    Jun. 19, 2008

(30) Foreign Application Priority Data

Dec. 19, 2006  (KR) ........................ 10-2006-0130111

(51) Int. Cl.
*G06F 3/038* (2006.01)
*G09G 5/00* (2006.01)

(52) U.S. Cl. ........................ 345/212; 313/504

(58) Field of Classification Search ............ 345/76–102, 345/36, 45, 212; 315/169.1, 169.3
See application file for complete search history.

(56) References Cited

U.S. PATENT DOCUMENTS 7,310,078 B2 * 12/2007 Kim ................................. 345/76
7,570,257 B2 *  8/2009 Ikeda ............................. 345/204

FOREIGN PATENT DOCUMENTS

| KR | 10-2002-0027932 A | 4/2002 |
| KR | 10-2006-0004254 A | 1/2006 |
| KR | 10-2006-0023314 A | 3/2006 |

OTHER PUBLICATIONS

Korean Notice of Allowance issued on Feb. 14, 2008 in Korean Patent Application 9-5-2008-08174925.

* cited by examiner

*Primary Examiner* — Alexander Eisen
*Assistant Examiner* — Kenneth B Lee, Jr.
(74) *Attorney, Agent, or Firm* — Knobbe Martens Olson & Bear, LLP

(57) ABSTRACT

An organic light emitting display device capable of displaying an image having a uniform luminance is disclosed. The organic light emitting display device includes a scan driver for supplying a scan signal to scan lines, supplying a control signal to control lines and supplying a light emitting control signal to light emitting control lines. The device also includes a data driver for supplying a data signal to data lines and pixels, each pixel including an organic light emitting diode, a second transistor connected to the scan lines and the data lines, a first transistor connected between a second electrode of the second transistor and the organic light emitting diode, a storage capacitor having one terminal connected to a gate electrode of the first transistor and the other terminal connected to the control lines, and a third transistor connected between a gate electrode and a second electrode of the first transistor.

31 Claims, 4 Drawing Sheets

ORGANIC LIGHT EMITTING DISPLAY DEVICE

CROSS-REFERENCE TO RELATED APPLICATION

This application claims priority to and the benefit of Korean Patent 10-2006-0130111, filed on Dec. 19, 2006, in the Korean Intellectual the entire content of which is incorporated herein by reference.

BACKGROUND

1. Field

The field relates to an organic light emitting display device, and more specifically to an organic light emitting display device capable of displaying an image having a uniform luminance and simultaneously minimizing the number of transistors.

2. The Related Technology

In recent years, there have been may attempts to develop various flat panel displays with less weight and volume than a cathode ray tube, which are problematic in the cathode ray tube. The flat panel display includes a liquid crystal display, a field emission display, a plasma display panel, an organic light emitting display device, etc.

Amongst flat panel display devices, the organic light emitting display device displays an image using an organic light emitting diode which generates the lights by means of recombination of electrons and holes. Such an organic light emitting display device has an advantage that it has a rapid response time and may be also driven with low power consumption.

FIG. 1 is a circuit view showing a pixel of a conventional organic light emitting display device.

Referring to FIG. 1, the pixel 4 of the conventional organic light emitting display device includes an organic light emitting diode (OLED), and a pixel circuit 2 connected to a data line (Dm) and a scan line (Sn) to control the organic light emitting diode (OLED).

An anode electrode of the organic light emitting diode (OLED) is connected to the pixel circuit 2, and a cathode electrode is connected to a second power source (ELVSS). Such an organic light emitting diode (OLED) generates the light having a luminance corresponding to an electric current supplied to the pixel circuit 2.

The pixel circuit 2 controls a current supplied to the organic light emitting diode (OLED) according to a data signal supplied to the data line (Dm) while a scan signal is supplied to the scan line (Sn). For this purpose, the pixel circuit 2 includes a second transistor (M2) connected between a first power source (ELVDD) and the organic light emitting diode (OLED); a first transistor (M1) connected to the second transistor (M2), the data line (Dm) and the scan line (Sn); and a storage capacitor (Cst) connected between a gate electrode and a first electrode of the second transistor (M2).

The gate electrode of the first transistor (M1) is connected to the scan line (Sn), and the first electrode is connected to the data line (Dm). And, the second electrode of the first transistor (M1) is connected to one terminal of the storage capacitor (Cst). The first electrode is either a source electrode or a drain electrode, and the second electrode is the electrode different than the first electrode. For example, a second electrode may be a drain electrode if the first electrode is a source electrode. The first transistor (M1) is connected to the scan line (Sn) and the data line (Dm) is turned on while a scan signal is supplied to the scan line (Sn), thereby supplying a data signal, from the data line (Dm), to the storage capacitor (Cst). As a result, the storage capacitor (Cst) stores a voltage corresponding to the data signal.

The gate electrode of the second transistor (M2) is connected to one terminal of the storage capacitor (Cst), and the first electrode is connected to the other terminal of the storage capacitor (Cst) and to the first power source (ELVDD). The second electrode of the second transistor (M2) is connected to the anode electrode of the organic light emitting diode (OLED). The second transistor (M2) controls current according to a voltage value stored in the storage capacitor (Cst), wherein the current flows from the first power source (ELVDD) to the second power source (ELVSS) through the organic light emitting diode (OLED). The organic light emitting diode (OLED) generates light corresponding to the current supplied to the second transistor (M2).

However, the pixel 4 of has a problem that it is impossible to display an image having a uniform luminance. This is so because a threshold voltage of the second transistor (M2) (the drive transistor) in each of the pixels 4 has different values because of schedule variance, and other factors. Because the threshold voltage of the drive transistor has different values, light having different luminance is generated in the organic light emitting diode (OLED) due to the difference in the resulting current of the drive transistor even if a data signal corresponding to the same grey levels is supplied to a large number of pixels 4.

In order to solve the above problems, there has been proposed a configuration in which transistors are further added to each of the pixels 4 to compensate for a threshold voltage of the drive transistor. Actually, there has been proposed a configuration in which 6 transistors and one capacitor are used for each of the pixels 4 to compensate for a threshold voltage of the drive transistor. However, the size of the pixels 4 is increased if the 6 transistors are included in each of the pixels 4. Also, the possibility of erroneous operation is increased with a large number of transistors in the pixels 4, resulting in the reduced yield of the organic light emitting display device during manufacturing.

SUMMARY OF CERTAIN INVENTIVE ASPECTS

One aspect is an organic light emitting display device including a scan driver configured to sequentially supply a scan signal to a plurality of scan lines, to sequentially supply a control signal to a plurality of control lines, and to sequentially supply a light emitting control signal to a plurality of light emitting control lines, a data driver configured to supply a data signal to a plurality of data lines, and a plurality of pixels. Each pixel includes an organic light emitting diode, a second transistor connected to one of the scan lines and one of the data lines and configured to be turned on when the scan signal is supplied thereto, a first transistor connected between a second electrode of the second transistor and the organic light emitting diode, the first transistor configured to control a current which flows from a first power source to a second power source through the organic light emitting diode, a storage capacitor having one terminal connected to a gate electrode of the first transistor and the other terminal connected to one of the control lines, and a third transistor connected between a gate electrode and a second electrode of the first transistor, the third transistor configured to be turned on when the light emitting control signal is supplied thereto.

Another aspect is an organic light emitting display device including a scan driver configured to supply a scan signal to a scan line, to supply a control signal to a control line, and to supply a light emitting control signal to a light emitting control line, a data driver configured to supply a data voltage to a data line, and a plurality of pixels. Each pixel includes an organic light emitting diode, a storage capacitor configured to store the data voltage, a drive transistor configured to supply a current to the organic light emitting diode according to the stored data voltage, the gate of the drive transistor being connected to the storage capacitor, where the drive transistor is further configured to supply the data voltage to the storage capacitor.

BRIEF DESCRIPTION OF THE DRAWINGS

These and/or other embodiments and features will become apparent and more readily appreciated from the following description of certain exemplary embodiments taken in conjunction with the accompanying drawings of which.

DETAILED DESCRIPTION OF CERTAIN INVENTIVE EMBODIMENTS

Figure 1:
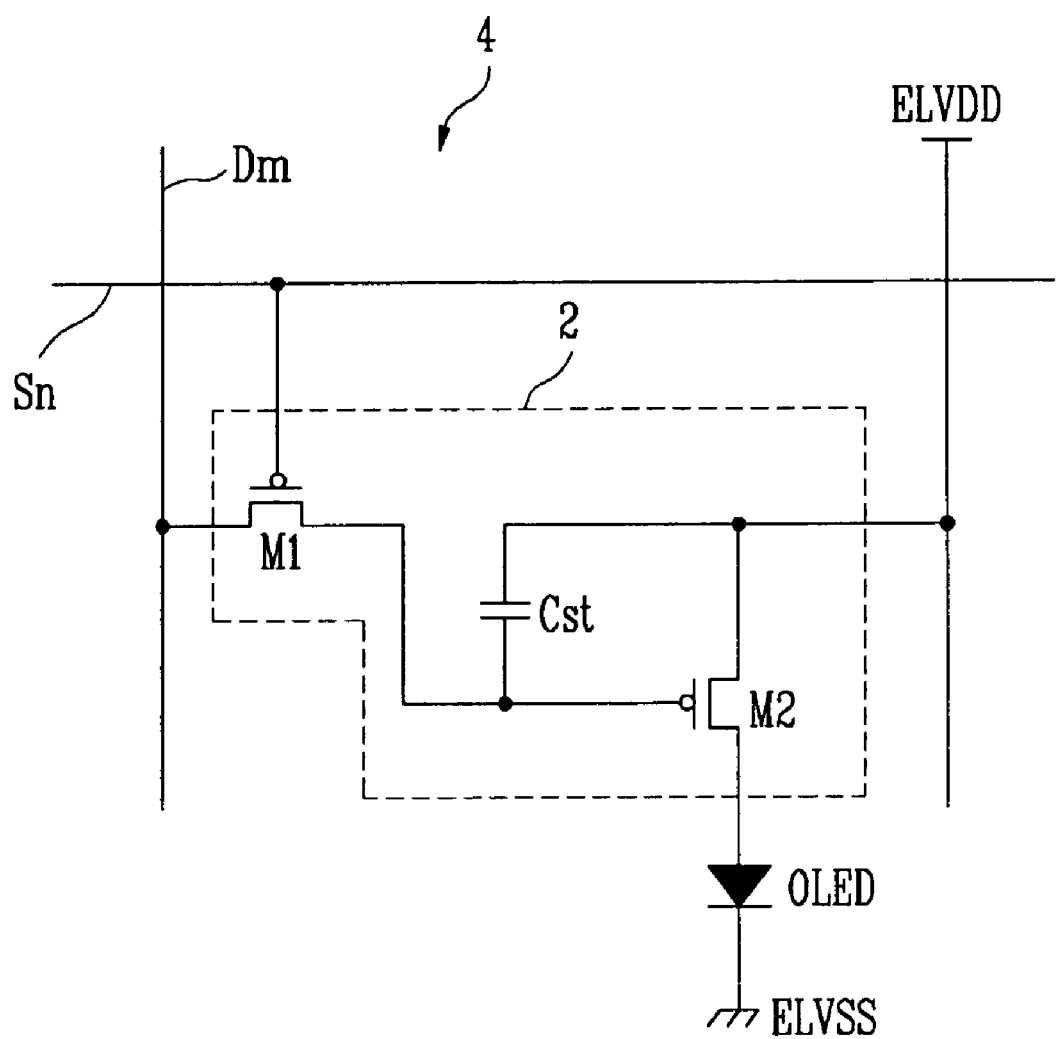
FIG. 1 is a circuit view showing a conventional pixel.

Certain embodiments will be described with reference to the accompanying drawings. While a first element is described herein as being connected to a second element, the first element may be directly connected to the second element or may be indirectly connected to the second element via one or more additional elements. Further, some elements that are not essential to the complete understanding of the invention are omitted for clarity. Also, like reference numerals generally refer to like elements throughout.

Figure 2:
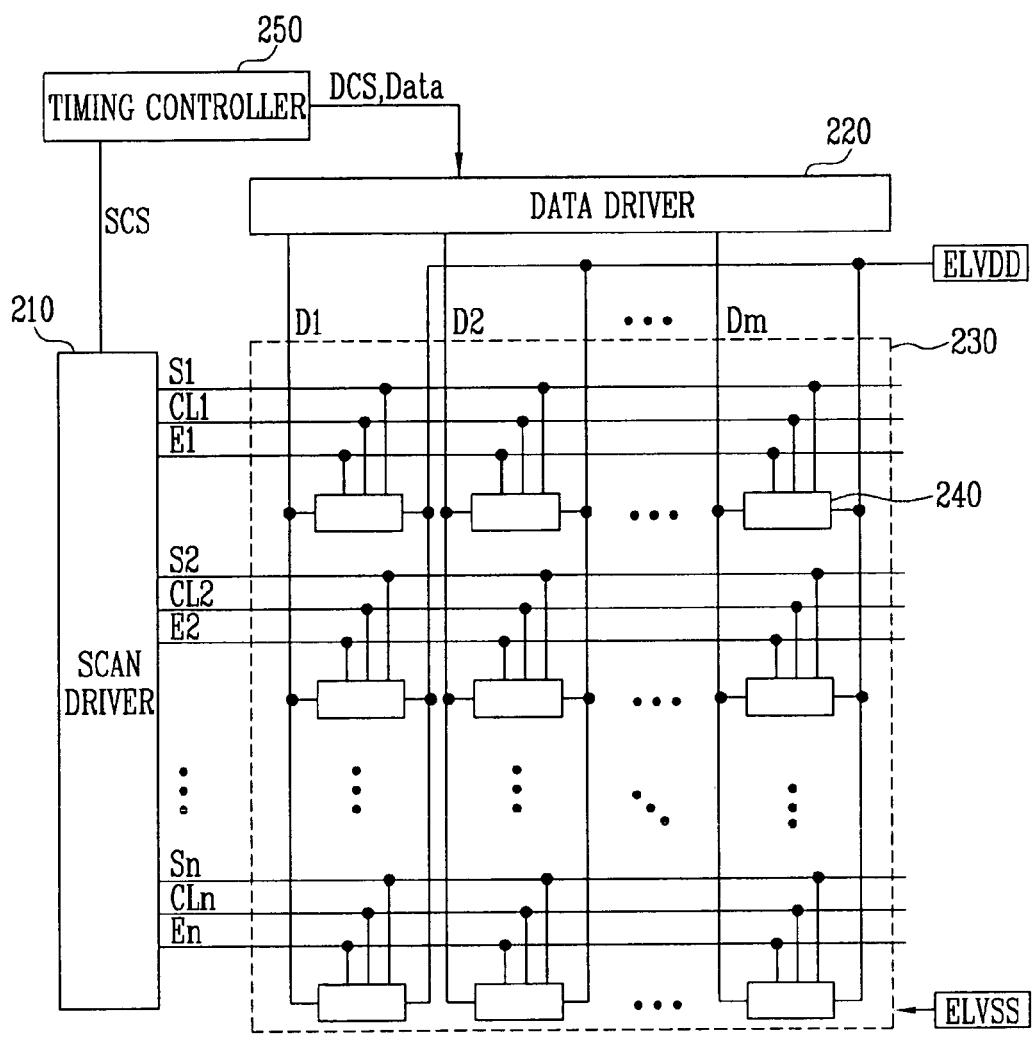
FIG. 2 is a diagram showing an organic light emitting display device according to one embodiment.

FIG. 2 is a diagram showing an organic light emitting display device according to one embodiment.

Referring to FIG. 2, the organic light emitting display device includes a pixel unit 230 including pixels 240 arranged to be connected with scan lines (S1 to Sn), light emitting control lines (E1 to En), control lines (CL1 to CLn) and data lines (D1 to Dm); a scan driver 210 for driving the scan lines (S1 to Sn), the light emitting control lines (E1 to En) and the control lines (CL1 to CLn); a data driver 220 for driving the data lines (D1 to Dm); and a timing controller 250 for controlling the scan driver 210 and the data driver 220.

The scan driver 210 receives a scan drive control signal (SCS) from the timing controller 250. The scan driver 210 receiving the scan drive control signal (SCS) generates a scan signal, and sequentially supplies the generated scan signal to the scan lines (S1 to Sn). Also, the scan driver 210 generates a control signal in response to the scan drive control signal (SCS), and sequentially supplies the generated control signal to the control lines (CL1 to CLn). The scan driver 210 also generates a light emitting control signal, and sequentially supplies the generated light emitting control signal to the light emitting control lines (E1 to En).

The control signal is set to a wider width than the scan signal, and the control signal supplied to certain pixels 240 is overlapped with scan signal supplied to certain pixels 240. The light emitting control signal is set to a wider width than the scan signal, and the light emitting control signal supplied to certain pixels 240 is supplied before the scan signal supplied to certain pixels 240 and overlapped with the scan signal.

More particularly, a control signal is supplied to an $i^{th}$ control line (CLi) at a certain time after a light emitting control signal is supplied to an $i^{th}$ light emitting control line (Ei). A scan signal is supplied to the $i^{th}$ scan line (Si) after the control signal is supplied to the $i^{th}$ control line (CLi). Then, the supply of the $i^{th}$ control line (CLi) and the $i^{th}$ light emitting control line (Ei) is suspended after the supply of the scan signal to the $i^{th}$ scan line (Si) is suspended. As described above, the pixels 240 are reset during a period before the control signal is supplied after the light emitting control signal is supplied. In addition, a voltage corresponding to a data signal is charged in the pixels 240 during a period while the scan signal is supplied. For this purpose, the light emitting control signal, the scan signal and the control signal are all of the same polarity. For example, the light emitting control signal, the scan signal and the control signal may be a low polarity.

The data driver 220 receives a data drive control signal (DCS) from the timing controller 250. The data driver 220 receiving the data drive control signal (DCS) generates a data signal, and supplies the generated data signal to the data lines (D1 to Dm) so as to synchronize with the scan signal.

The timing controller 250 generates a data drive control signal (DCS) and a scan drive control signal (SCS) to correspond to synchronizing signals supplied from the outside. The data drive control signal (DCS) generated in the timing controller 250 is supplied to the data driver 220, and the scan drive control signal (SCS) is supplied to the scan driver 210. And, the timing controller 250 supplies a data, supplied from the outside, to the data driver 220.

The pixel unit 230 receives a first power source (ELVDD) and a second power source (ELVSS) and supplies the first power source (ELVDD) and the second power source (ELVSS) to each of the pixels 240. Each of the pixels 240 receiving the first power source (ELVDD) and the second power source (ELVSS) generates light corresponding to the data signal.

Figure 3:
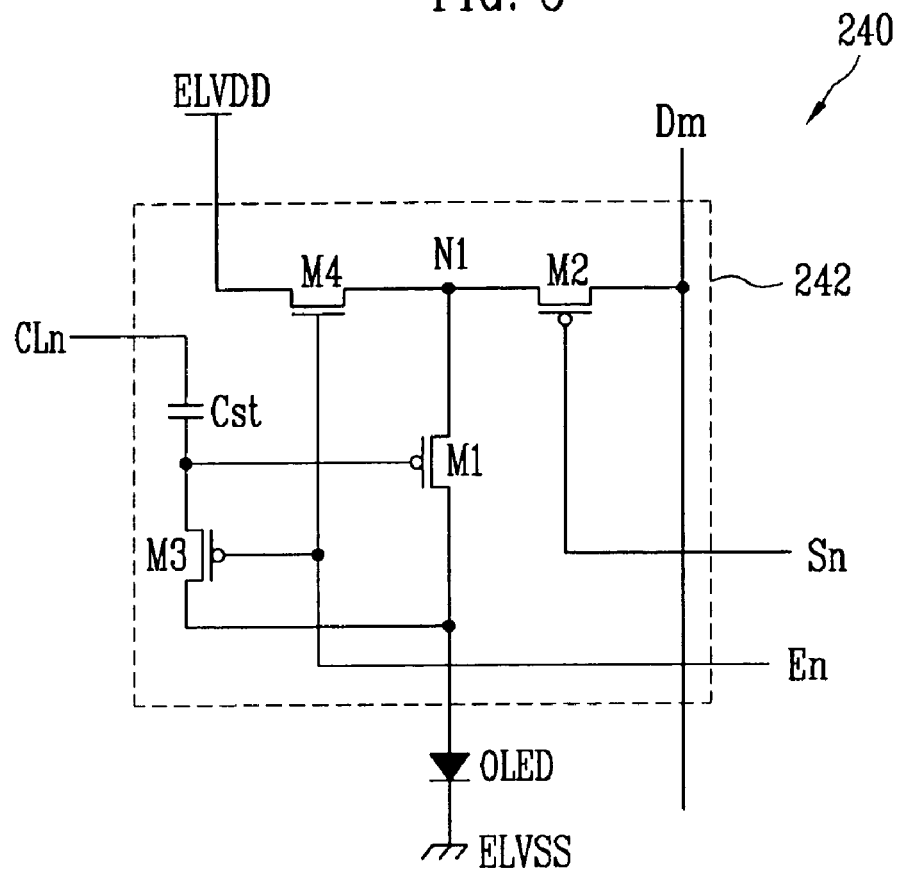
FIG. 3 is a circuit view showing an embodiment of the pixel as shown in FIG. 2.

FIG. 3 is a diagram showing the first embodiment of a pixel as shown in FIG. 2. For convenience sake of description, assume that a pixel is connected with an $n^{th}$ scan line (Sn) and an $m^{th}$ data line (Dm), as shown in FIG. 3.

Referring to FIG. 3, the pixel 240 includes an organic light emitting diode (OLED), and a pixel circuit 242 connected to the data lines (Dm) and the scan lines (Sn) and configured to control a current supplied to the organic light emitting diode (OLED).

An anode electrode of the organic light emitting diode (OLED) is connected to the pixel circuit 242, and a cathode electrode is connected to the second power source (ELVSS). The organic light emitting diode (OLED) generates the light having luminance to correspond to an electric current supplied to the pixel circuit 242.

The pixel circuit 242 controls current while the scan signal is supplied to the scan lines (Sn), and the current is supplied from the first power source (ELVDD) to the second power source (ELVSS) through the organic light emitting diode (OLED) according to the data signal supplied to the data lines (Dm). For this purpose, the pixel circuit 242 includes first to fourth transistors (M1 to M4) and a storage capacitor (Cst).

A first electrode of the second transistor (M2) is connected to the data lines (Dm), and a second electrode is connected to the first node (N1). The gate electrode of the second transistor (M2) is connected to an $n^{th}$ scan line (Sn). The transistor (M2)

is turned on while a scan signal is supplied to the n$^{th}$ scan line (Sn), thereby electrically connecting the data lines (Dm) with the first node (N1).

A first electrode of the first transistor (M1) (drive transistor) is connected to the first node (N1), and a second electrode is connected to an anode electrode of the organic light emitting diode (OLED). The gate electrode of the first transistor (M1) is connected to one terminal of the storage capacitor (Cst). The first transistor (M1) supplies an electric current to the organic light emitting diode (OLED), the electric current corresponding to a voltage charged in the storage capacitor (Cst).

A first electrode of the third transistor (M3) is connected to the second electrode of the first transistor (M1), and a second electrode is connected to the gate electrode of the first transistor (M1). And, a gate electrode of the third transistor (M3) is connected to the light emitting control lines (En). The third transistor (M3) is turned on while a light emitting control signal is supplied to the light emitting control lines (En), thereby diode connecting the first transistor (M1).

A second electrode of the fourth transistor (M4) is connected to the first power source (ELVDD), and a first electrode is connected to the first node (N1). In addition, a gate electrode of the fourth transistor (M4) is connected to the light emitting control line (En). The fourth transistor (M4) is turned off while a light emitting control signal is Supplied, and turned on while a light emitting control signal is not supplied. For this purpose, the fourth transistor (M4) is formed in a conductive type different from the third transistor (M3). For example, as shown in FIG. 3, the fourth transistor (M4) is an NMOS type, and the third transistor (M3) is a PMOS type. In the embodiment shown in FIG. 3, the first transistor (M1) and the second transistor (M2) are also formed with a PMOS type.

One terminal of the storage capacitor (Cst) is connected to the gate electrode of the first transistor (M1), and the other terminal is connected to the control lines (CLn). The storage capacitor (Cst) stores a voltage corresponding to a data signal while a control signal is supplied to the control lines (CLn), and changes a voltage of the gate electrode of the first transistor (M1) while the supply of the control signal to the control lines (CLn) is suspended. The storage capacitor (Cst) increases the voltage of the gate electrode of the first transistor (M1) while the supply of the control signal is suspended, that is, while a voltage of the control line (CLn) increases from a low voltage to a high voltage.

Figure 4:
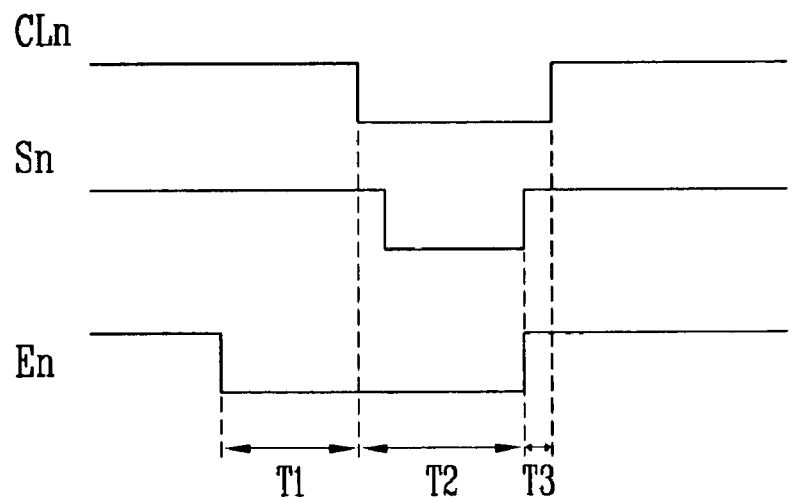
FIG. 4 is a waveform view showing a method for driving the pixel as shown in FIG. 3.

FIG. 4 is a waveform view showing a method for driving the pixel as shown in FIG. 3.

Hereinafter, operation of the pixel will be described in reference to FIG. 3 and FIG. 4. First, a light emitting control signal is supplied to the light emitting control lines (En) during a first period (T1). While the light emitting control signal is supplied to the light emitting control line (En), the fourth transistor (M4) is turned off, and the third transistor (M3) is turned on. While the fourth transistor (M4) is turned off, the first power source (ELVDD) and the first node (N1) are electrically isolated. If the third transistor (M3) is turned on, voltages of one terminal of the storage capacitor (Cst) and the gate electrode of the first transistor (M1) are reset to a voltage near the second power source (ELVSS). The voltage of one terminal of the storage capacitor (Cst) and the gate electrode of the first transistor (M1) is reset to a voltage obtained by adding the first power source (ELVSS) to a threshold voltage (OLED_Vth) of the organic light emitting diode.

The voltage of the data signal is not supplied from the data lines (Dm) to the first node (N1) because the second transistor (M2) is turned-off during the first period (T1). Accordingly, the gate electrode of the first transistor (M1) may be stably reset during the first period (T1).

A control signal and a scan signal are supplied during a second period (T2). If the control signal is supplied to the control line (CLn), then a voltage of the other terminal of the storage capacitor (Cst) is reduced. As described above, the voltage of the gate electrode of the first transistor (M1) is lowered while the voltage of the other terminal of the storage capacitor (Cst) is lowered. For example, the voltage of the gate electrode of the first transistor (M1) is lowered according to the changed voltage of 10V if a voltage of 10V is supplied to the control lines (CLn) while the control signal is not supplied, and a voltage of 0V is supplied to the control lines (CLn) while a control signal is supplied.

The second transistor (M2) is turned on if a scan signal is supplied to the scan lines (Sn). The data signal is supplied to the first node (N1) if the second transistor (M2) is turned on. Here, the first transistor (M1) is turned on since the voltage of the gate electrode of the first transistor (M1) has been reduced by the control signal, and therefore the data signal supplied to the first node (N1) is supplied to one terminal of the storage capacitor (Cst) via the first transistor (M1) and the third transistor (M3). In this case, voltages corresponding to the data signal and the threshold voltage of the first transistor (M1) are charged in the storage capacitor (Cst) since the data signal is supplied to the storage capacitor (Cst) via the diode connected first transistor (M1).

The voltage of the data signal is a lower voltage value than the voltage obtained by adding the second power source (ELVSS) to the threshold voltage (OLED_Vth) of the organic light emitting diode. As described above, if the voltage of the data signal is set to a lower voltage value than a voltage obtained by adding the second power source (ELVSS) to a threshold voltage (OLED_Vth) of the organic light emitting diode, then the organic light emitting diode (OLED) is off while the data signal is supplied thereto. That is to say, a voltage corresponding to the data signal may be stably charged in the storage capacitor (Cst) by turning the organic light emitting diode (OLED) off during a period while the data signal is supplied thereto.

The scan signal and the light emitting control signal is suspended during a third period (T3). The second transistor (M2) is turned off while the scan signal is suspended. The third transistor (M3) is turned off and the fourth transistor (M4) is turned on while the supply of the light emitting control signal is suspended.

Then, the control signal is suspended. (That is to say, a voltage of the control lines (CLn) ascends to a high voltage.) While the supply of the control signal is suspended, the voltage of the gate electrode is increased. That is to say, a data signal having a low voltage is supplied to charge the storage capacitor (Cst), and a voltage stored in the storage capacitor (Cst) is increased by suspending the control signal.

The first transistor (M1) supplies an electric current from the first power source (ELVDD) to the second power source (ELVSS) through the organic light emitting diode (OLED) according to the voltage supplied to the gate electrode in itself.

The fourth transistor (M4) is an NMOS type. Generally, an NMOS-type transistor has not been used in pixel circuits having an organic light emitting diode.

NMOS transistor parameters have high process variation when compared to PMOS transistors. Accordingly, it is difficult to display a uniform image because of the variations in threshold voltage, etc. if the NMOS transistor is used as a drive transistor. Also, the NMOS transistor has a high leakage current when compared to the PMOS transistor. Accordingly, it is difficult to display an image with a voltage having a desired luminance because of the high leakage current if pixels are made with the NMOS transistor.

In the pixels 240, the fourth transistor (M4) functions regardless of the variation in the threshold voltage since it is not used as the drive transistor. Also, in the pixels 240, the leakage current by the fourth transistor (M4) does not affect the voltage charged in the storage capacitor (Cst), and therefore an image may be displayed with a voltage having a desired luminance. In some embodiments, the fourth transistor (M4) is a PMOS type transistor.

Figure 5:
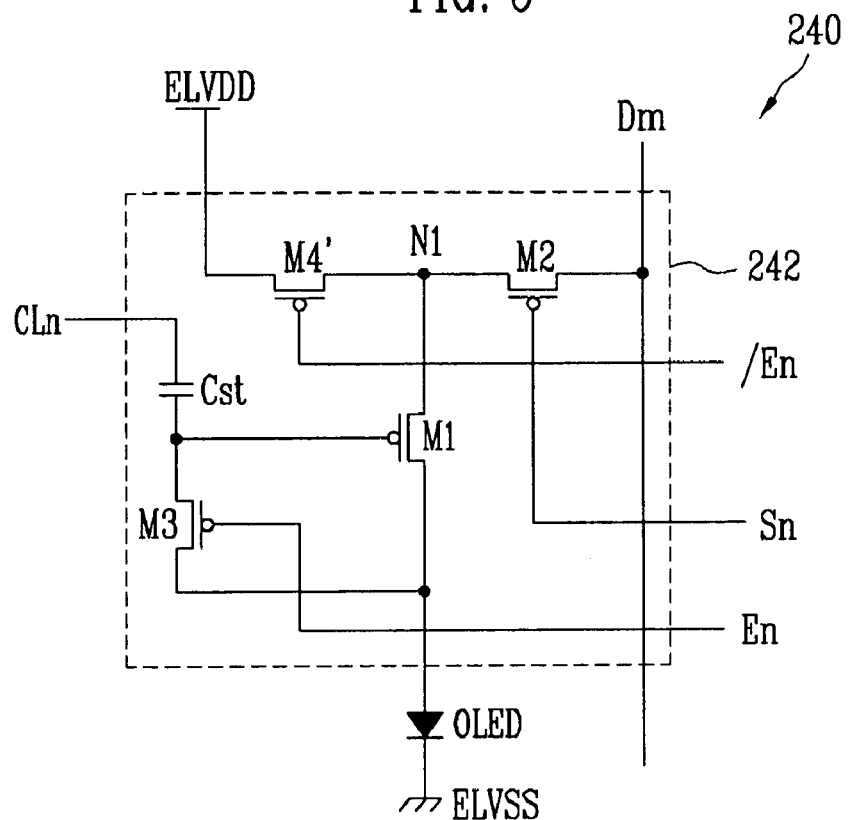
FIG. 5 is a circuit view showing the second embodiment of the pixel as shown in FIG. 2.

FIG. 5 is a circuit view showing an embodiment of the pixel as shown in FIG. 2. The same parts as in the configuration of FIG. 3 are assigned as the same reference numerals in a configuration of FIG. 5.

Referring to FIG. 5, a fourth transistor (M4') is a PMOS transistor. The fourth transistor (M4') is connected between the first node (N1) and the first power source (ELVDD), and controlled with an inverted light emitting control signal supplied to inverted light emitting control line (/En). The inverted light emitting control signal is supplied at substantially the same time point as the light emitting control signal and has an inverted polarity. Accordingly, the fourth transistor (M4') is turned off when the inverted light emitting control signal is supplied, and turned on when the inverted light emitting control signal is not supplied.

Figure 6:
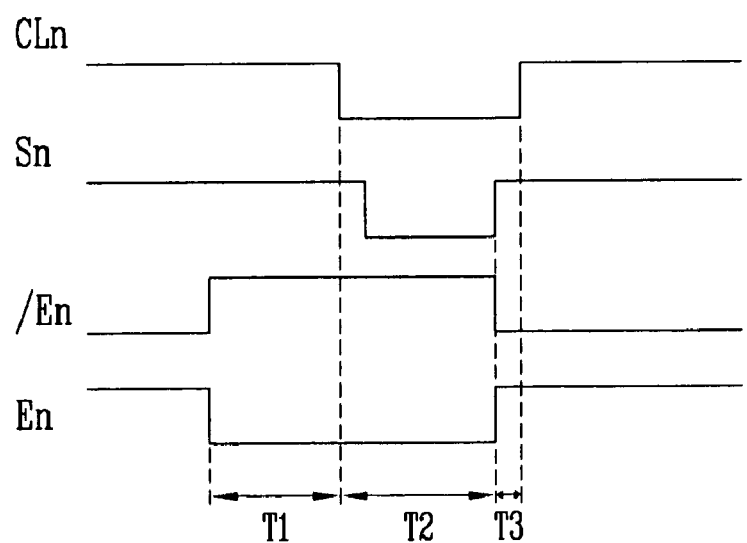
FIG. 6 is a waveform view showing a method for driving the pixel as shown in FIG. 5.

Operation of the pixel will be described in reference to FIG. 5 and FIG. 6. First, a light emitting control signal is supplied to the light emitting control lines (En) and an inverted light emitting control signal is supplied to the inverted light emitting control line (/En) during a first period (T1). The third transistor (M3) is turned on while the light emitting control signal is supplied to the light emitting control lines (En). The fourth transistor (M4') is off when the inverted light emitting control signal is supplied to the inverted light emitting control lines (/En).

The first power source (ELVDD) and the first node (N1) are electrically isolated when the fourth transistor (M4) is turned off. Voltages of one terminal of the storage capacitor (Cst) and the gate electrode of the first transistor (M1) are reset while the third transistor (M3) is turned on.

A control signal and a scan signal are supplied during a second period (T2). A voltage of the other terminal of the storage capacitor (Cst) is changed from a low state to a high state while the control signal is supplied to the control lines (CLn). (That is to say, the voltage of the other terminal of the storage capacitor (Cst) is reduced.) As described above, the voltage of the gate electrode of the first transistor (M1) is reduced if the voltage of the other terminal of the storage capacitor (Cst) is lowered.

The second transistor (M2) is turned on while a scan signal is supplied to the scan lines (Sn). A data signal is supplied to the first node (N1) while the second transistor (M2) is turned on. Accordingly, the first transistor (M1) is on since the voltage of the gate electrode of the first transistor (M1) is reduced by the control signal, and therefore the data signal supplied to the first node (N1) is supplied to one terminal of the storage capacitor (Cst) through the first transistor (M1) and the third transistor (M3). As a result, a voltage corresponding to the data signal and the threshold voltage of the first transistor (M1) is stored in the storage capacitor (Cst) because the data signal is supplied to the storage capacitor (Cst) through the diode connected first transistor (M1).

The scan signal, the light emitting control signal and the inverted light emitting control signal are suspended during a third period (T3). The second transistor (M2) is turned off while the scan signal is suspended. The third transistor (M3) is turned off while the light emitting control signal is suspended. The fourth transistor (M4) is turned on while the inverted light emitting control signal is suspended.

Then, the control signal is suspended. (That is to say, a voltage of the control line (CLn) is increased to a high voltage.) A voltage of the gate electrode of the first transistor (M1) increases according to the increase of the voltage in the control lines (CLn) when the control signal is suspended. For example, a data signal having a low voltage may be supplied to charge the storage capacitor (Cst), and the voltage charged in the storage capacitor (Cst) may increase because of suspending the control signal.

The first transistor (M1) supplies a predetermined electric current from the first power source (ELVDD) to the second power source (ELVSS) via the organic light emitting diode (OLED) according to the voltage supplied to the gate electrode.

As described above, the organic light emitting display device according to the embodiments may be useful to display an image having a uniform luminance because the voltage stored in the storage capacitor is determined based on the threshold voltage of the first transistor included in each of the pixels. Also, a configuration of the pixels may be simplified because the pixels have only four transistors and one capacitor, and therefore the aperture ratio may be enhanced, and the possibility of erroneous operation is also reduced. Furthermore, the gate electrode of the drive transistor may be stably reset because the data lines and the pixels are electrically isolated during a period when the gate electrode of the drive transistor is reset.

Although embodiments have been shown and described, it would be appreciated by those skilled in the art that changes might be made in these embodiments without departing from the principles and spirit of the invention.

What is claimed is:

1. An organic light emitting display device comprising:
   a scan driver configured to sequentially supply a scan signal to a plurality of scan lines, to sequentially supply a control signal to a plurality of control lines, and to sequentially supply a light emitting control signal to a plurality of light emitting control lines;
   a data driver configured to supply a data signal to a plurality of data lines; and
   a plurality of pixels, each pixel comprising:
      an organic light emitting diode;
      a second transistor connected to one of the scan lines and one of the data lines and configured to be turned on when the scan signal is supplied thereto;
      a first transistor connected between a second electrode of the second transistor and the organic light emitting diode, the first transistor configured to control a current which flows from a first power source to a second power source through the organic light emitting diode, wherein the first transistor is configured to be selectively diode-connected by the light emitting control signal;
      a storage capacitor having one terminal connected to a gate electrode of the first transistor and the other terminal connected to one of the control lines, wherein the other terminal is configured to receive the control signal from the one control line; and
      a third transistor connected between a gate electrode and a second electrode of the first transistor, the third transistor configured to be turned on when the light emitting control signal is supplied thereto.

2. The organic light emitting display device according to claim 1, wherein the scan driver is configured to control a supply time of the light emitting control signal and the scan signal so that the second transistor is turned off during a time when the voltage of a gate electrode of the first transistor and a first terminal of the storage capacitor is reduced to a voltage substantially equal to the sum of a voltage of the second power source and a threshold voltage of the organic light emitting diode when the third transistor is turned on.

3. The organic light emitting display device according to claim 2, wherein the scan driver is configured to supply the control signal to a second terminal of the storage capacitor after a gate electrode of the first transistor and the first terminal of the storage capacitor are reduced to a voltage value substantially equal to the sum of a voltage of the second power source and a threshold voltage of the organic light emitting diode while the third transistor is turned on.

4. The organic light emitting display device according to claim 3, wherein the control signal is supplied during a time the scan signal is also supplied.

5. The organic light emitting display device according to claim 3, wherein a voltage of the gate electrode of the first transistor is configured to be reduced according to a change in voltage of the control signal as a result of the control signal being supplied.

6. The organic light emitting display device according to claim 4, wherein the data driver is configured to supply the data signal such that the data signal is synchronized with the scan signal.

7. The organic light emitting display device according to claim 6, wherein the second terminal of the storage capacitor is configured to receive a voltage of the control signal while a voltage corresponding to the data signal is charged, and wherein the supply of the control signal is configured to be suspended after the voltage corresponding to the data signal is stored in the storage capacitor.

8. The organic light emitting display device according to claim 7, wherein the voltage of the gate electrode of the first transistor is configured to be increased while the supply of the control signal is suspended.

9. The organic light emitting display device according to claim 1, further comprising a fourth transistor connected between the first electrode of the first transistor and the first power source, the fourth transistor configured to be turned off when the light emitting control signal is supplied thereto and to be turned on when the supply of the light emitting control signal is suspended.

10. The organic light emitting display device according to claim 1, further comprising a fourth transistor connected between the first electrode of the first transistor and the first power source, the fourth transistor configured to be turned off when an inverted light emitting control signal is supplied from inverted light emitting control lines and turned on when the supply of the inverted light emitting control signal is suspended.

11. The organic light emitting display device according to claim 10, wherein the inverted light emitting control signal is supplied at substantially the same time as the light emitting control signal and has an inverted polarity of the light emitting control signal.

12. An organic light emitting display device comprising:
a scan driver configured to supply a scan signal to a scan line, to supply a control signal to a control line, and to supply a light emitting control signal to a light emitting control line;
a data driver configured to supply a data voltage to a data line; and
a plurality of pixels, each pixel comprising:
an organic light emitting diode;
a storage capacitor configured to store a voltage based on the data voltage, the storage capacitor having an electrode connected to the control line and being configured to receive the control signal from the one control line; and
a drive transistor connected to the organic light emitting diode, the gate of the drive transistor being connected to the storage capacitor, and the drive transistor being configured to supply a current to the organic light emitting diode according to the stored data voltage and to supply the data voltage to the storage capacitor, wherein the drive transistor is configured to be selectively diode-connected by the light emitting control signal.

13. The organic light emitting display device according to claim 12, further comprising a second transistor, connected to between the gate of the drive transistor and another electrode of the transistor.

14. The organic light emitting display device according to claim 12, wherein the second transistor is configured to selectively diode connect the drive transistor.

15. The organic light emitting display device according to claim 14, wherein the second transistor is configured to selectively diode connect the drive transistor according to the light emitting control signal.

16. The organic light emitting display device according to claim 12, wherein the drive transistor is configured to supply the data voltage to the storage capacitor through the second transistor.

17. The organic light emitting display device according to claim 12, further comprising a third transistor configured to supply the data voltage to the drive transistor according to the scan signal.

18. The organic light emitting display device according to claim 12, further comprising a fourth transistor connected to the drive transistor, the fourth transistor configured to supply the current to the drive transistor.

19. The organic light emitting display device according to claim 18, wherein the fourth transistor is configured to supply the current to the drive transistor according to the light emitting control signal.

20. A method of driving an organic light emitting display device, the method comprising:
sequentially supplying a scan signal to a plurality of scan lines;
sequentially supplying a control signal to a plurality of control lines;
sequentially supplying a light emitting control signal to a plurality of light emitting control lines;
supplying a data signal to a plurality of data lines;
in response to one of the scan signals, turning on a second transistor, wherein the second transistor is connected to one of the scan lines and to one of the data lines;
with a first transistor, controlling a current from a first power source to a second power source through an organic light emitting diode, wherein first transistor is connected between the second transistor and the organic light emitting diode, wherein the first transistor is configured to be selectively diode-connected by the light emitting control signal;
in response to one of the light emitting control signals, turning on a third transistor, wherein the third transistor is connected between a gate electrode and a second electrode of the first transistor;

turning on the first transistor with one of the control signals applied to the storage capacitor having one terminal connected to a gate electrode of the first transistor and the other terminal connected to one of the control lines, wherein the one control signal is applied to the other terminal from the one control line.

21. The method of claim 20, wherein the one light emitting control signal is supplied while the one scan signal is suspended and while the one control signal is suspended.

22. The method of claim 21, wherein the one control signal is supplied while the one light emitting control signal is supplied and while the one scan signal is suspended.

23. The method of claim 22, wherein the one scan signal is supplied while the one light emitting control signal is supplied and while the one scan signal is supplied.

24. The method of claim 23, wherein the one light emitting control signal is suspended and the one scan signal is suspended while the one control signal is supplied.

25. The method of claim 24, wherein the one control signal is suspended while the one scan signal is suspended, and while the one light emitting control signal is supplied.

26. A method of driving an organic light emitting display device, the method comprising:
- sequentially supplying a scan signal to a plurality of scan lines;
- sequentially supplying a control signal to a plurality of control lines;
- sequentially supplying a light emitting control signal to a plurality of light emitting control lines;
- sequentially supplying an inverted light emitting control signal to a plurality of inverted light emitting control lines;
- supplying a data signal to a plurality of data lines;
- in response to one of the scan signals, turning on a second transistor, wherein the second transistor is connected to one of the scan lines and to one of the data lines;
- with a first transistor, controlling a current from a first power source to a second power source through an organic light emitting diode, wherein first transistor is connected between the second transistor and the organic light emitting diode;
- in response to one of the light emitting control signals, turning on a third transistor, wherein the third transistor is connected between a gate electrode and a second electrode of the first transistor, wherein the first transistor is configured to be selectively diode-connected by the third transistor;
- turning on the first transistor with one of the control signals applied to the storage capacitor having one terminal connected to a gate electrode of the first transistor and the other terminal connected to one of the control lines, wherein the one control signal is applied to the other terminal from the one control line; and
- in response to one of the inverted light emitting control signals, turning on a fourth transistor, wherein the fourth transistor is connected between a first electrode of the first transistor and the first power source.

27. The method of claim 26, wherein the one light emitting control signal is supplied and the one inverted light emitting control signal is suspended while the one scan signal is suspended and while the one control signal is suspended.

28. The method of claim 27, wherein the one control signal is supplied while the one light emitting control signal is supplied, while the one inverted light emitting control signal is suspended, and while the one scan signal is suspended.

29. The method of claim 28, wherein the one scan signal is supplied while the one light emitting control signal is supplied, the one inverted light emitting control signal is suspended, and while the one scan signal is supplied.

30. The method of claim 29, wherein the one light emitting control signal is suspended, the one inverted light emitting control signal is supplied, and the one scan signal are suspended while the one control signal is supplied.

31. The method of claim 30, wherein the one control signal is suspended while the one scan signal is suspended, while the one light emitting control signal is supplied, and while the one inverted light emitting control signal is suspended.

* * * * *

EX PARTE REEXAMINATION CERTIFICATE (48th)
Ex Parte Reexamination Ordered under 35 U.S.C. 257

United States Patent
Choi

(10) Number: US 8,314,788 C1
(45) Certificate Issued: Dec. 23, 2015

(54) ORGANIC LIGHT EMITTING DISPLAY DEVICE

(75) Inventor: Sang-moo Choi, Suwon-si (KR)

(73) Assignee: SAMSUNG DISPLAY CO., LTD., Yongin, Gyeonggi-do (KR)

Supplemental Examination Request:
No. 96/000,107, May 21, 2015

Reexamination Certificate for:
Patent No.: 8,314,788
Issued: Nov. 20, 2012
Appl. No.: 12/004,283
Filed: Dec. 19, 2007

(30) Foreign Application Priority Data

Dec. 19, 2006 (KR) .................. 10-2006-0130111

(51) Int. Cl.
*G06F 3/038* (2013.01)
*G09G 5/00* (2006.01)
*G09G 3/32* (2006.01)
*H01L 27/32* (2006.01)

(52) U.S. Cl.
CPC ...... *G09G 3/3233* (2013.01); *G09G 2300/0465* (2013.01); *G09G 2300/0861* (2013.01); *G09G 2300/0866* (2013.01); *G09G 2310/0251* (2013.01); *G09G 2310/06* (2013.01); *G09G 2320/0233* (2013.01); *G09G 2320/043* (2013.01); *H01L 27/3244* (2013.01)

(58) Field of Classification Search
None
See application file for complete search history.

(56) References Cited

To view the complete listing of prior art documents cited during the supplemental examination proceeding and the resulting reexamination proceeding for Control Number 96/000,107, please refer to the USPTO's public Patent Application Information Retrieval (PAIR) system under the Display References tab.

*Primary Examiner* — Christina Y Leung

(57) ABSTRACT

An organic light emitting display device capable of displaying an image having a uniform luminance is disclosed. The organic light emitting display device includes a scan driver for supplying a scan signal to scan lines, supplying a control signal to control lines and supplying a light emitting control signal to light emitting control lines. The device also includes a data driver for supplying a data signal to data lines and pixels, each pixel including an organic light emitting diode, a second transistor connected to the scan lines and the data lines, a first transistor connected between a second electrode of the second transistor and the organic light emitting diode, a storage capacitor having one terminal connected to a gate electrode of the first transistor and the other terminal connected to the control lines, and a third transistor connected between a gate electrode and a second electrode of the first transistor.

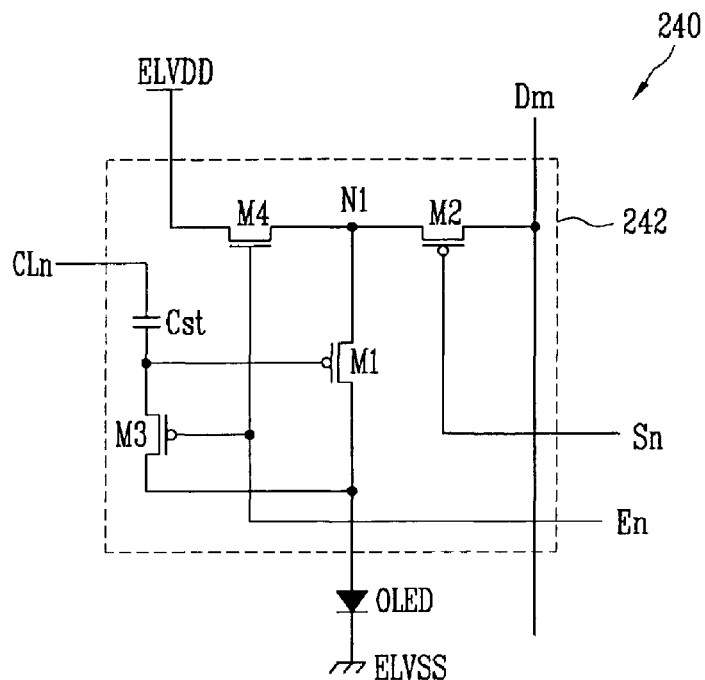

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-11 and 20-31 is confirmed.

Claims 12-14 and 16 are determined to be patentable as amended.

Claims 15 and 17-19, dependent on an amended claim, are determined to be patentable.

New claims 32 and 33 are added and determined to be patentable.

12. An organic light emitting display device comprising:
- a scan driver configured to supply a scan signal to a scan line, to supply a control signal to a control line, and to supply a light emitting control signal to a light emitting control line;
- a data driver configured to supply a data voltage to a data line; and
- a plurality of pixels, each pixel comprising:
  - an organic light emitting diode;
  - a storage capacitor configured to store a voltage based on the data voltage,
  - the storage capacitor having an electrode *directly* connected to the control line and being configured to receive the control signal from the one control line; and
  - a drive transistor connected to the organic light emitting diode, [the] gate of the drive transistor being connected to the storage capacitor, and the drive transistor being configured to supply a current to the organic light emitting diode according to the stored data voltage and to supply the data voltage to the storage capacitor, wherein the drive transistor is configured to be selectively diode-connected by the light emitting control signal.

13. The organic light emitting display device according to claim 12, further comprising a second transistor, connected to between [the] *a* gate of the drive transistor and [another] *a first* electrode of the *drive* transistor.

14. The organic light emitting display device according to claim [12] *13*, wherein the second transistor is configured to selectively diode connect the drive transistor.

16. The organic light emitting display device according to claim [12] *13*, wherein the drive transistor is configured to supply the data voltage to the storage capacitor through the second transistor.

*32. The organic light emitting display device according to claim 12, further comprising a second transistor connected to the scan line and the data line and configured to be turned on when the scan signal is supplied thereto, wherein the second transistor is directly connected to a second electrode of the drive transistor.*

*33. The organic light emitting display device according to claim 32, further comprising a third transistor connected between a ate electrode and a first electrode of the drive transistor, the third transistor configured to be turned on when the light emitting control signal is supplied thereto, wherein the third transistor is directly connected to the storage capacitor and the organic light emitting diode.*

\* \* \* \* \*